US006862546B2

(12) United States Patent
Kaburlasos et al.

(10) Patent No.: US 6,862,546 B2
(45) Date of Patent: Mar. 1, 2005

(54) INTEGRATED ADJUSTABLE SHORT-HAUL/ LONG-HAUL TIME DOMAIN REFLECTOMETRY

(75) Inventors: Nikos Kaburlasos, Sacramento, CA (US); James Little, Sacramento, CA (US); Vaishali Nikhade, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 447 days.

(21) Appl. No.: 10/080,473

(22) Filed: Feb. 22, 2002

(65) Prior Publication Data

US 2003/0163272 A1 Aug. 28, 2003

(Under 37 CFR 1.47)

(51) Int. Cl.⁷ ............................ G06F 19/00; G01R 31/11
(52) U.S. Cl. ......................................... 702/110; 324/533
(58) Field of Search ........................... 702/110; 324/533

(56) References Cited

U.S. PATENT DOCUMENTS

| 4,104,582 A | | 8/1978 | Lambertsen | |
|---|---|---|---|---|
| 4,970,466 A | * | 11/1990 | Bolles et al. | 324/533 |
| 5,586,054 A | * | 12/1996 | Jensen et al. | 324/533 |
| 5,751,149 A | * | 5/1998 | Oberg et al. | 324/533 |
| 6,097,755 A | * | 8/2000 | Guenther et al. | 375/228 |
| 6,534,996 B1 | * | 3/2003 | Amrany et al. | 324/533 |
| 6,621,562 B2 | * | 9/2003 | Durston | 356/73.1 |

FOREIGN PATENT DOCUMENTS

EP    0 652 442 A1    5/1995

OTHER PUBLICATIONS

"LXT360/361 Integrated T1/E1 LH/SH Transceivers for DS1/DSX–1/CSU or NTU/ISDN PRI Application", Level One, Mar. 1997.*

Intel Product Brief; Intel LXT3108, Octal 3.3V Long–haul/ Short–haul T1/E1/J1 Line Interface Unit; Order No. 249083–001; 2001.

Inter White Paper; Intelligent T1/E1/J1 Solutions for Voice Over Packet (VoP) Gateways; Order No. 249740–001; 2001.

* cited by examiner

Primary Examiner—John Barlow
Assistant Examiner—Toan M. Le
(74) Attorney, Agent, or Firm—Blakely, Sokoloff, Taylor & Zafman LLP

(57) ABSTRACT

A method and system for performing integrated adjustable short-haul/long-haul time domain reflectometry (TDR). A TDR pulse count is set to a predetermined number. Next, a TDR pulse is transmitted through a cable. The width of the TDR pulse is a function of the multiplication of the TDR pulse count with the period of a TDR clock. It is then determined whether the TDR pulse has been reflected back. If the TDR pulse has not been reflected, the TDR pulse count is successively increased to successively increase the width of the transmitted TDR pulse until a reflection is detected—indicating an open in the cable. Furthermore, it eliminates false detections of cable opens. Moreover, the system can be combined into a line interface unit (LIU) integrated circuit such that TDR functionality can be performed automatically without the use of a technician.

44 Claims, 7 Drawing Sheets

INTEGRATED ADJUSTABLE SHORT-HAUL/ LONG-HAUL TIME DOMAIN REFLECTOMETRY

BACKGROUND

1. Field of the Invention

The present invention relates to the field of networks. More particularly, embodiments of the invention relate to a method, circuit, and system for performing integrated adjustable short-haul/long-haul time domain reflectometry.

2. Description of the Related Art

In network environments, network cabling is a common source of problems. Often, cable test equipment is used by a technician to certify that a cable within the network is working properly. A wide array of cable test equipment is available to diagnose problems associated with cables in a network.

One particular type of cable test equipment often used by a technician is a time domain reflectometer, which can implement time domain reflectometery (TDR) functionality. TDR equipment is used to locate breaks or opens in cables. TDR equipment accomplishes this by sending a pulse through a cable and by measuring the time it takes for the pulse to reflect back to the TDR equipment. Reflections occur at opens in the cable. Thus, if there is an open somewhere down the cable, the pulse that was sent out will be reflected on the open and the reflection of the pulse returns to the TDR equipment. If no reflection returns, this is an indication that there is not an open on the cable (or that the open is so far down the cable that the reflection on the cable is not detectable).

Typically, TDR equipment transmits a pulse of a predetermined width and amplitude down the cable. If the reflection comes back, the elapsed time between the time at which the TDR pulse is completely transmitted from the TDR equipment and the time at which the reflection comes back, serves as an indication of how far from the TDR equipment the open is. The TDR equipment can take this elapsed time and convert this time to distance such that a distance reading can be calculated measuring the distance from the TDR equipment to the open.

A critical parameter of the TDR functionality is the width of the TDR pulse that is being sent through the network cable. The shorter the TDR pulse sent out, the closer to the TDR equipment an open can be detected. This is because TDR equipment typically measures the time that has elapsed from the moment the TDR pulse is completely sent out to the moment its reflection returns. Therefore, the shorter the time it takes for the TDR pulse to be completely transmitted (i.e. the narrower the TDR pulse is), the sooner the TDR equipment will start timing the distance at which the open occurs. Conversely, if a really wide TDR pulse is sent out and the open is just a few feet away from the TDR equipment, the reflection will return before the TDR pulse is done transmitting, in which case the TDR equipment will ignore the reflection and the open will not be detected.

On the other hand, the wider the TDR pulse that is transmitted, the longer the reach of the TDR function (i.e. the further away an open on the cable can be detected). However, arbitrarily wide pulses cannot be used for a number of reasons. For example, most commercially available transformers on cables would saturate if the TDR pulse width is more than approximately 10 microseconds. Further, the wider the TDR pulse is that is transmitted, the longer the shortest distance is at which an open on the cable can be detected.

Moreover, wider TDR pulses can cause transformers on cables to saturate and can be followed by a slowly leaking direct current (DC) level. Thus, a voltage slope that trails the actual TDR pulse can occur that interferes with the TDR functionality. This is because the voltage slope extends past the end of the TDR pulse and can, therefore, be falsely detected by the TDR equipment as a reflection. This causes the TDR equipment to falsely detect an open very near the TDR equipment.

For example, as shown in FIG. 1, a first TDR pulse 101 is transmitted. Also, another TDR pulse 102 is transmitted at a later time. Typically, multiple TDR pulses are sent out one after another with some spacing between them. Pulse 103 is the reflection of TDR pulse 101 and is coming back to the TDR equipment from an open on the cable down the line. As seen in FIG. 1, a trailing voltage slope 105 follows TDR pulse 101 after the end of pulse 101 and before the start of reflected pulse 103. Unfortunately, if this slope is above a certain voltage level, it can be falsely detected as a TDR reflection by the TDR equipment. Thus, the TDR equipment may falsely detect an open very close to the TDR equipment due to the trailing voltage slope 105.

Unfortunately, current TDR equipment is prone to false detections of cable opens, as previously described. Moreover, presently, when a cable within a network is suspected of not operating properly, a technician utilizing expensive TDR equipment must be sent out to the location of interest to test the cable.

BRIEF DESCRIPTION OF THE DRAWINGS

The features and advantages of the present invention will become apparent from the following description of the present invention in which.

DESCRIPTION

Figure 1:
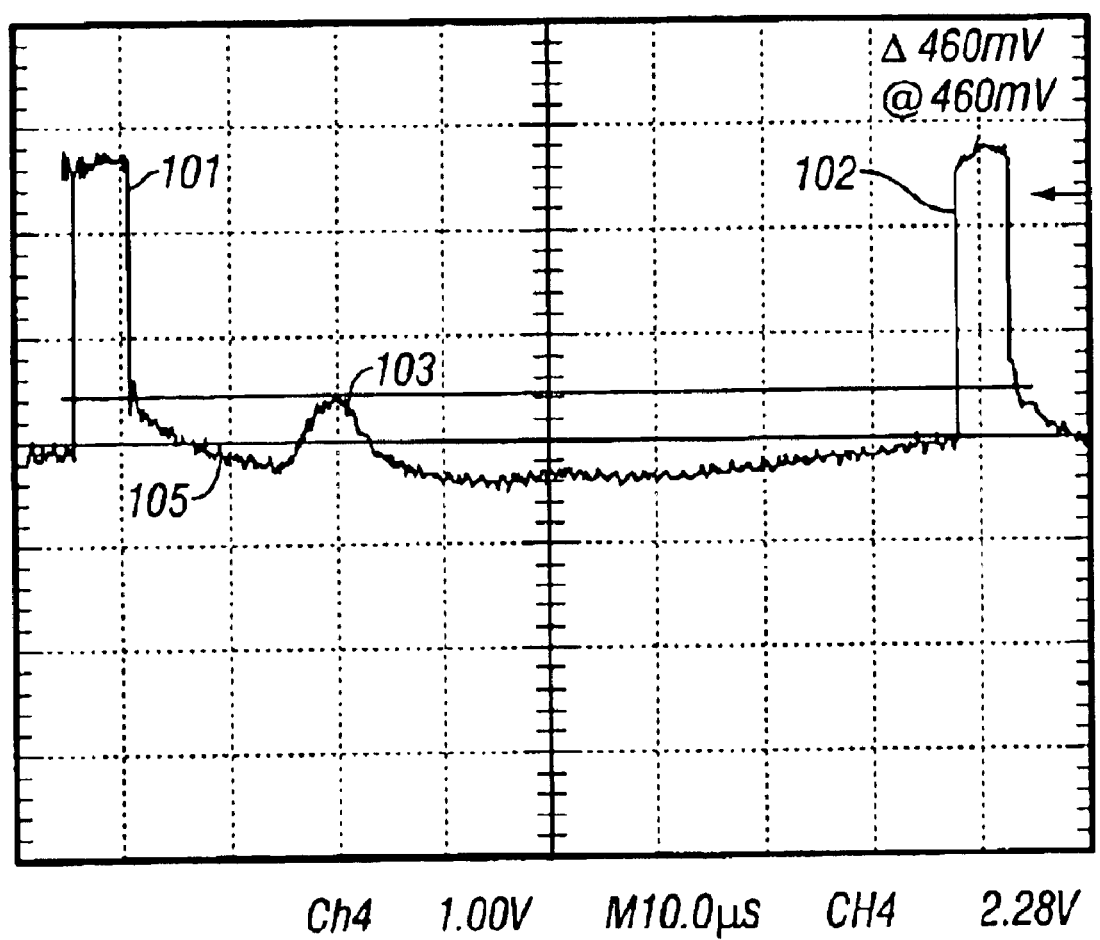
FIG. 1 is a graph illustrating a first pulse being transmitted from conventional time domain reflectometery (TDR) equipment, a trailing voltage slope causing the TDR equipment to falsely detect an open, and the true reflection of the pulse occurring at a later time.

Embodiments of the present invention relate to a method, circuit, and system for performing integrated adjustable short-haul/long-haul time domain reflectometry (TDR). In one embodiment of the invention, a TDR pulse count is set to a predetermined number. Next, a TDR pulse is transmitted through a cable. The width of the TDR pulse is a function of the multiplication of the TDR pulse count with the period of a TDR clock. It is then determined whether the TDR pulse has been reflected back. If the TDR pulse has not been reflected, the TDR pulse count is successively increased to successively increase the width of the transmitted TDR pulse until a reflection is detected—indicating an open in the cable. Furthermore, embodiments of the present invention eliminate false detections of cable opens. Moreover, embodiments of the present invention can be combined into a line interface unit (LIU) integrated circuit such that TDR functionality can be performed automatically without the use of a technician.

In the following description, the various embodiments of the present invention will be described in detail. However, such details are included to facilitate understanding of the invention and to describe exemplary embodiments for employing the invention. Such details should not be used to limit the invention to the particular embodiments described because other variations and embodiments are possible while staying within the scope of the invention. Furthermore, although numerous details are set forth in order to provide a thorough understanding of the present invention, it will be apparent to one skilled in the art that these specific details are not required in order to practice the present invention. In other instances details such as, well-known methods, types of data, protocols, procedures, components, networking equipment, electrical structures and circuits, are not described in detail, or are shown in block diagram form, in order not to obscure the present invention. Furthermore, aspects of the invention will be described in particular embodiments but may be implemented in hardware, software, firmware, middleware, or a combination thereof.

In the following description, certain terminology is used to describe various environments in which embodiments of the present invention can be practiced. In general, a "communication system" comprises one or more end nodes having connections to one or more networking devices of a network. More specifically, a "networking device" comprises hardware and/or software used to transfer information through a network. Examples of a networking device include a multi-access service device, a router, a switch, a repeater, or any other device that facilitates the forwarding of information. An "end node" normally comprises a combination of hardware and/or software that constitutes the source or destination of the information. Examples of an end node include a Switch utilized in the Public Switched Telephone Network (PSTN), Local Area Network (LAN), Private Branch Exchange (PBX), telephone, fax machine, video source, computer, printer, workstation, application server, set-top box and the like. "Data traffic" generally comprises one or more signals having one or more bits of data, address, control or any combination thereof transmitted in accordance with any chosen packeting scheme. "Data traffic" can be data, voice, address, and/or control in any representative signaling format or protocol. A "link" is broadly defined as one or more physical or virtual information-carrying mediums that establish a communication pathway such as, for example, optical fiber, electrical wire, cable, bus traces, wireless channels (e.g. radio, satellite frequency, etc.) and the like.

Figure 2:
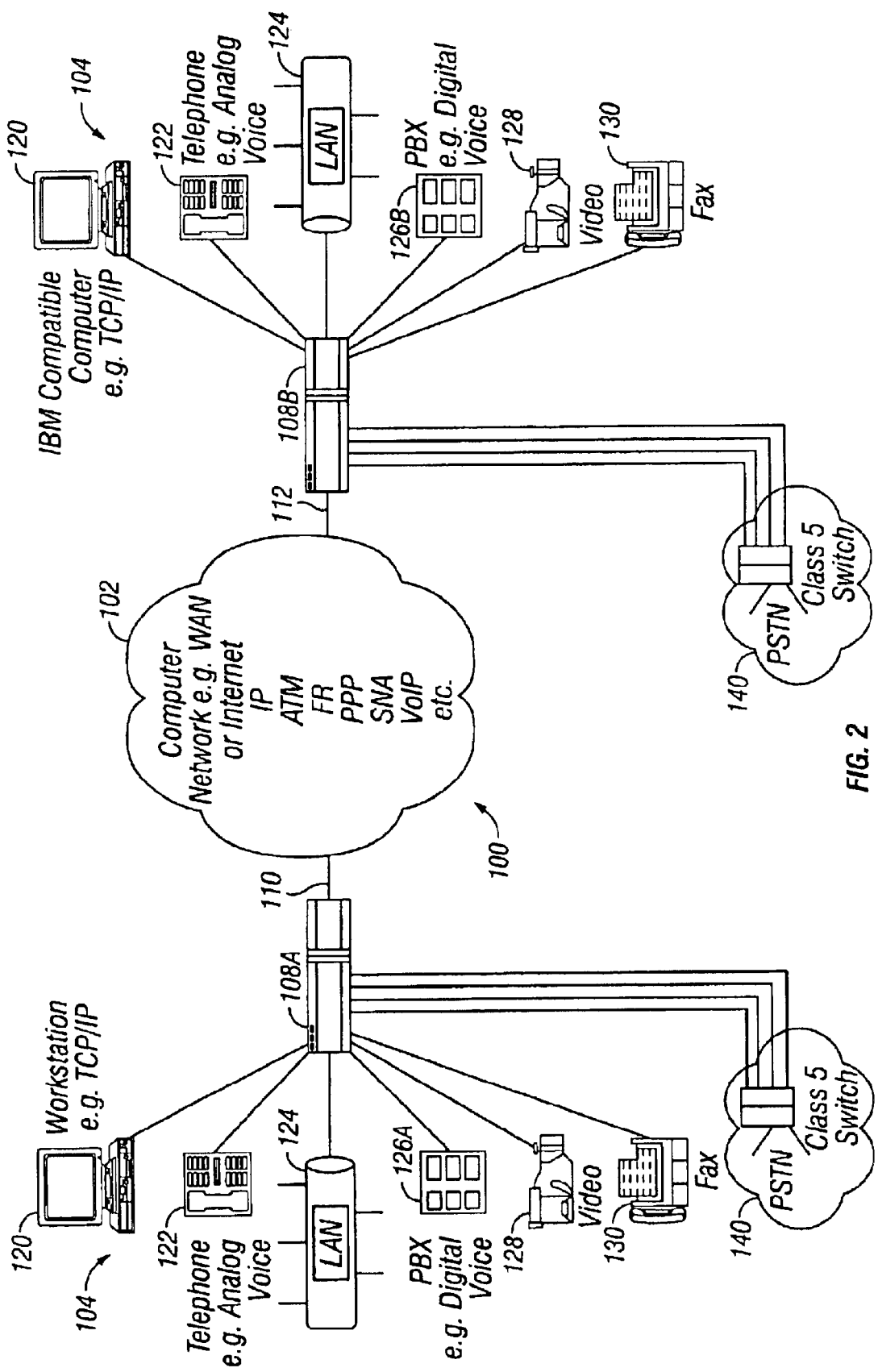
FIG. 2 shows an illustrative example of a voice and data communications system.

FIG. 2 shows an illustrative example of a voice and data communications system 100. The communication system 100 includes a computer network (e.g. a wide area network (WAN) or the Internet) 102 which is a packetized or a packet-switched network that can utilize Internet Protocol (IP), Asynchronous Transfer Mode (ATM), Frame Relay (FR), Point-to Point Protocol (PPP), Systems Network Architecture (SNA), Voice over Internet Protocol (VoIP), or any other sort of protocol. The computer network 102 allows the communication of data traffic, e.g. voice/speech data and other types of data, between any end nodes 104 in the communication system 100 using packets. Data traffic through the network may be of any type including voice, graphics, video, audio, e-mail, Fax, text, multi-media, documents and other generic forms of data. The computer network 102 is typically a data network that may contain switching or routing equipment designed to transfer digital data traffic. At each end of the communication system 100 the voice and data traffic requires packetization when transceived across the network 102.

The communication system 100 includes networking devices, such as multi-service access devices 108A and 108B, in order to packetize data traffic for transmission across the computer network 102. A multi-service access device 108 is a device for connecting multiple networks (e.g. a first network to a second network) and devices that use different protocols and also generally includes switching and routing functions. Access devices 108A and 108B are coupled together by network links 110 and 112 to the computer network 102.

Voice traffic and data traffic may be provided to a multiservice access device 108 from a number of different end nodes 104 in a variety of digital and analog formats. For example, in the exemplary environment shown in FIG. 2, the different end nodes include a class 5 Switch 140 utilized as part of the PSTN, computer/workstation 120, a telephone 122, a LAN 124, a PBX 126, a video source 128, and a fax machine 130 connected via links to the access devices. However, it should be appreciated any number of different types of end nodes can be connected via links to the access devices. In the communication system 100, digital voice, fax, and modem traffic are transceived at PBXs 126A, 126B, and Switch 140, which can be coupled to multiple analog or digital telephones, fax machines, or data modems (not shown). Particularly, the digital voice traffic can be transceived with access devices 108A and 108B, respectively, over the computer packet network 102. Moreover, other data traffic from the other end nodes: computer/workstation 120 (e.g. TCP/IP traffic), LAN 124, and video 128, can be transceived with access devices 108A and 108B, respectively, over the computer packet network 102.

Also, analog voice and fax signals from telephone 122 and fax machine 130 can be transceived with multi-service access devices 108A and 108B, respectively, over the computer packet network 102. The access devices 108 convert the analog voice and fax signals to voice/fax digital data traffic, assemble the voice/fax digital data traffic into packets, and send the packets over the computer packet network 102.

Thus, packetized data traffic in general, and packetized voice traffic in particular, can be transceived with multiservice access devices 108A and 108B, respectively, over the computer packet network 102. Generally, an access device 108 packetizes the information received from a source end node 104 for transmission across the computer packet network 102. Usually, each packet contains the target address, which is used to direct the packet through the computer network to its intended destination end node. Once the packet enters the computer network 102, any number of networking protocols, such as TCP/IP, ATM, FR, PPP, SNA, VoIP, etc., can be employed to carry the packet to its intended destination end node 104. The packets are generally sent from a source access device to a destination access device over a virtual paths or a connection established between the access devices. The access devices are usually responsible for negotiating and establishing the virtual paths are connections. Data and voice traffic received by the access devices from the computer network are depacketized and decoded for distribution to the appropriate destination end node. It should be appreciated that the FIG. 2 environment is only an exemplary illustration to show how various types of end nodes can be connected to access devices and that embodiments of the present invention can be used with any type of end nodes, network devices, computer networks, and protocols.

Figure 3:
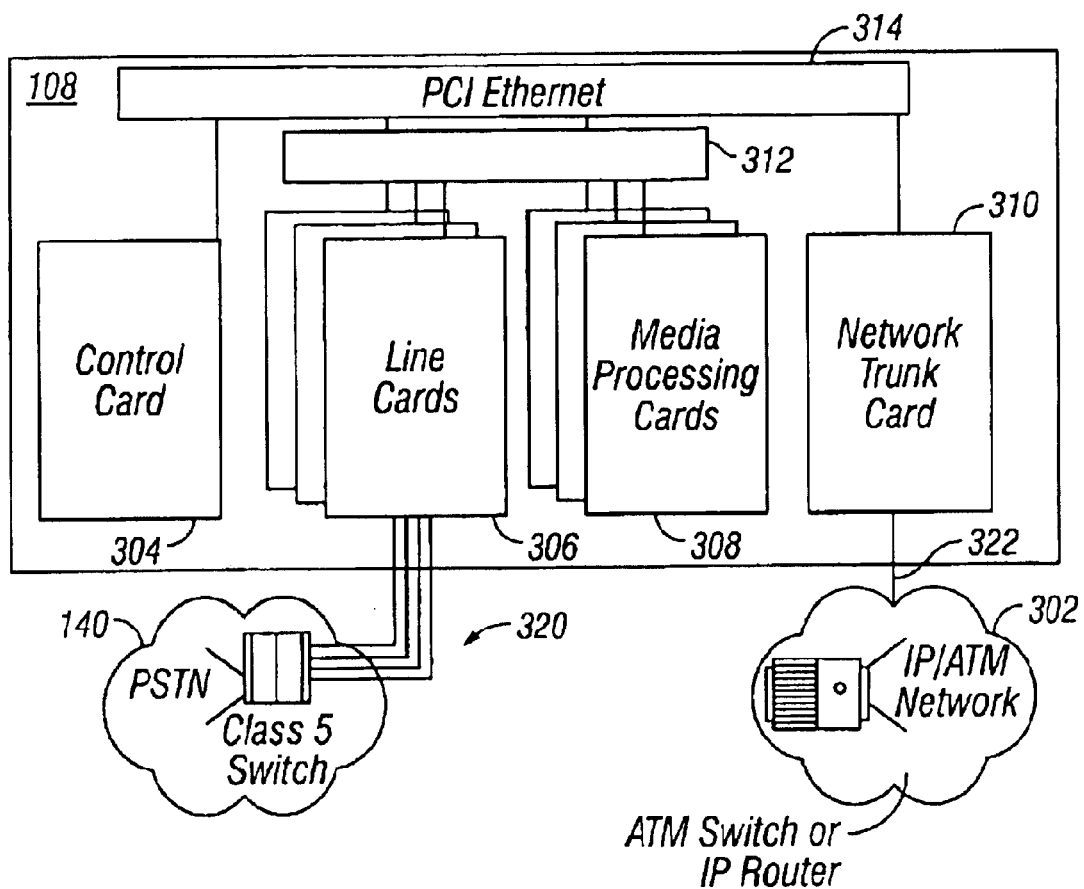
FIG. 3 is a simplified block diagram illustrating a conventional multi-service access device in which embodiments of the present invention can be practiced.

FIG. 3 is a simplified block diagram illustrating a conventional multi-service access device 108 in which embodiments of the present invention can be practiced. As shown in FIG. 3, the conventional multi-service access device 108 includes a control card 304, a plurality of line cards 306, a plurality of media processing cards 308, and a network trunk card 310. Continuing with the example of FIG. 2, the switch 140 can be connected to the multi-service access device 108 by connecting cables into the line cards 306, respectively. On the other side, the network trunk card 310 can connect the multi-service access device 108 to the computer network 102 (e.g. the Internet) through an ATM switch or IP router 302. All of the various cards in this exemplary architecture can be connected through standard buses. As an example, all of the cards 304, 306, 308, and 310, are connected to one another through a Protocol Control Information (PCI)/Ethernet bus 314. The PCI/Ethernet bus 314 connects the network trunk card 310 to the media processing cards 308 and carries the packetized traffic and/or control and supervisory messages from the control card 304. Also, the line cards 306 and the media processing cards 308 are particularly connected to one another through a bus 312. The bus 312 can be a Time Division Multiplexing (TDM) bus (e.g. an H.110 computer telephony bus) that carries the individual timeslots from the line cards 306 to the media processing cards 308.

In this example, the multi-service access device 108 can act as a voice over packet (VoP) gateway to interface a digital TDM switch 140 on the PSTN side to a router or ATM switch 302 on the IP/ATM side. The connection to the TDM switch is typically a group of multiple T1/E1/J1 cable links 320 forming a GR-303 or V5.2 interface whereas the IP/ATM interface typically consists of a Digital Signal Level 3 (DS3) or Optical Carrier Level 3 (OC-3) cable link 322. Thus, in this example, the multi-service access device 108 can perform the functions of providing voice over a computer network, such as the Internet.

Looking particularly at the cards, the control card 304 typically acts as a supervisory element responsible for centralized functions such as configuring the other cards, monitoring system performance, and provisioning. Functions such as signaling gateway or link control may also reside in this card. It is not uncommon for systems to offer redundant control cards given the critical nature of the functions they perform. As to the media processing cards 308, as the name indicates, these cards are responsible for processing media—e.g. voice traffic. This includes tasks such as timeslot switching, voice compression, echo canceling, comfort noise generation, etc. Packetization of the voice traffic may also reside in this card. The network trunk card 310 contains the elements needed to interface to the packet network. The network trunk card 310 maps the network packet (cells) into a layer one physical interface such as DS-3 or OC-3 for transport over the network backbone. As to the line cards 306, these cards form the physical interface to the multiple T1/E1/J1 cable links 320. These cards provide access to the individual voice timeslots and to the "control" channels in a GR-303 or V5.2 interface. The line cards 306 also provide access to the TDM signaling mechanism. It should be appreciated that this is a simplified example of a multi-service access device 108 that will be used to highlight aspects of embodiments of the present invention and that other multi-service access devices, routers, gateways, switches etc., used in conjunction with the line cards, are well-known in the art, and can just as easily be used with embodiments of the present invention.

Figure 4:
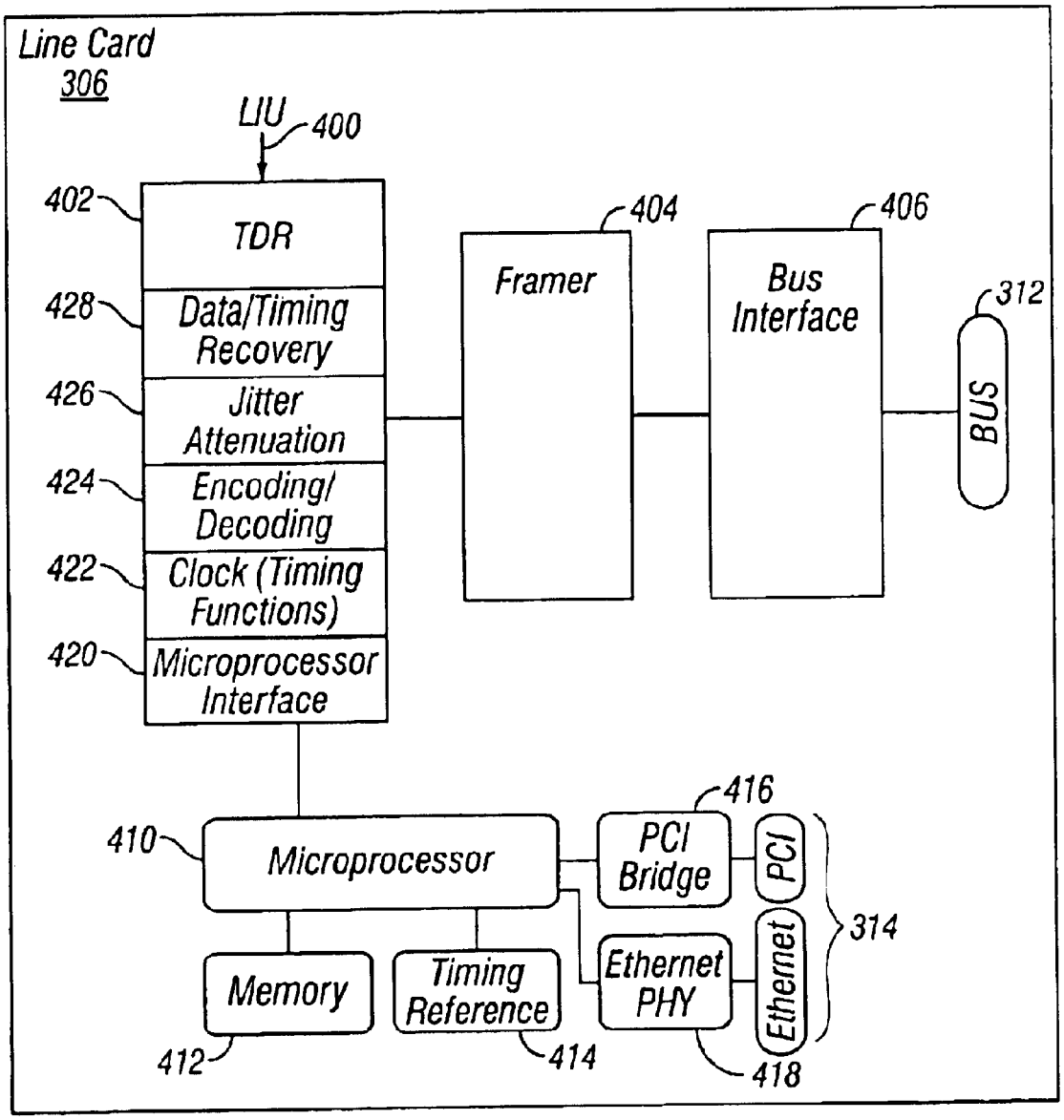
FIG. 4 is a simplified block diagram of a conventional line card of a multi-service access device, and particularly illustrates a line interface unit (LIU) integrated circuit, in which embodiments of the present invention can be practiced.

FIG. 4 is a simplified block diagram of a conventional line card 306 of a multi-service access device 108, and particularly illustrates a line interface unit (LIU) integrated circuit 400, in which embodiments of the present invention can be practiced. As can be seen in FIG. 4, the conventional line card 306 includes a framer 404, a bus interface 406 to interface with the bus 312, microprocessor 410, memory 412, a timing reference 414, a PCI bridge 416 to interface with the PCI portion of the bus 314, and an Ethernet physical connection 418 to interface with the Ethernet portion of the bus 314. The conventional line card 306 can be viewed as having two separate paths, a media path and a control path. The control information is carried over the PCI and Ethernet links and is processed by the microprocessor 410 whereas the media path starts at the T1/E1/J1 physical layer in the LIU 400 and goes through the framer 404 and a timeslot switching device. The media path carries for example TDM voice channels, as well as signaling information used to set up and tear down voice calls, in the present Voice over Packet (VoP) example.

Looking particularly at the framer 404, the framer 404 implements an important role by giving access to individual voice channels (sometimes called "bearer" channels). The framer 404 also provides convenient access to other communication "channels" implemented within the T1/E1/J3 frames through dedicated High-Level Data Link Control (HDLC) controllers. These communication "channels" contain the control protocols forming a GR-303 or V5.2 protocol. The framer 404 also extracts and inserts signaling information that is important to implement signaling gateway functions. In addition, the framer 404 performs monitoring and reporting functions. The bus interface 406 connects the framer 404 (e.g. TDM bus) to the bus 312 (e.g. an H.110 computer telephony bus). The bus interface 406 allows for the connection to any of the timeslots in the bus 312 and performs local timeslot switching.

Now looking particularly at the LIU 400, the LIU 400 performs many of typical LIU functions and is similar in architecture to most conventional LIU's. Particularly, the LIU 400 includes a microprocessor interface 420, a clock 422 to implement timing functions, encoding/decoding functionality 424, jitter attenuation functionality 426, data/timing recovery functionality 428, and according to one embodiment of the invention TDR functionality 402, as will be discussed in more detail later. The LIU 400 performs conventional functions such as terminating analog signals (e.g. T1/E1/J1 signals), performs clock and data recovery, and decoding/encoding functions. The LIU 400 may also performed jitter attenuation on input signals, as well as, other conventional functions associated with LIU's.

As will be discussed, embodiments of the present invention relate to performing adjustable short-haul and long-haul TDR functions automatically. This TDR functionality can be implemented on the LIU integrated chip 400 and can be programmable such that it can be adjusted to different network environments. Moreover, because the TDR functionality is implemented on an integrated chip, it can be performed automatically thereby bypassing the traditional need for sending out a technician to perform TDR functions with specialized TDR equipment to diagnose opens on the cables of a network. It should be appreciated that although the example network environment 100 was shown in FIG. 2, the example of a multi-service access device 108 was shown in FIG. 3, the example of a line card 306 and a line interface unit 400 was shown in FIG. 4, that these are only examples of environments (e.g. line cards, line interface units, and network devices) that the TDR functionality according to embodiments of the invention can be used with. Further, it should be appreciated that the TDR functionality according to embodiments of the invention can be implemented in a wide variety of LIU chips, line cards, and network devices—such as ATM gateways, wireless base stations, routers, framer relay access devices, switches, purely computer based networks (e.g. for non-voice digital data), other types of voice gateways etc., and that the previous multi-service access device and VoP environment were only given as an example to aid in illustrating one potential environment for the TDR functionality according to embodiments of the invention, as will now be discussed.

Further, those skilled in the art will recognize that the exemplary environments illustrated in FIGS. 2–4 are not intended to limit the present invention. Moreover, while aspects of the invention and various functional components have been described in particular embodiments, it should be appreciated these aspects and functionalities can be implemented in hardware, software, firmware, middleware or a combination thereof.

Embodiments of the present invention relate to a method, circuit, and system for performing integrated adjustable short-haul/long-haul time domain reflectometry (TDR). In one embodiment of the invention, a TDR pulse count is set to a predetermined number. Next, a TDR pulse is transmitted through a cable. The width of the TDR pulse is a function of the multiplication of the TDR pulse count with the period of a TDR clock. It is then determined whether the TDR pulse has been reflected back. If the TDR pulse has not been reflected, the TDR pulse count is successively increased to successively increase the width of the transmitted TDR pulse until a reflection is detected—indicating an open in the cable. Furthermore, embodiments of the present invention eliminate false detections of cable opens. Moreover, embodiments of the present invention can be combined into a line interface unit (LIU) integrated circuit such that TDR functionality can be performed automatically without the use of a technician.

Figure 5:
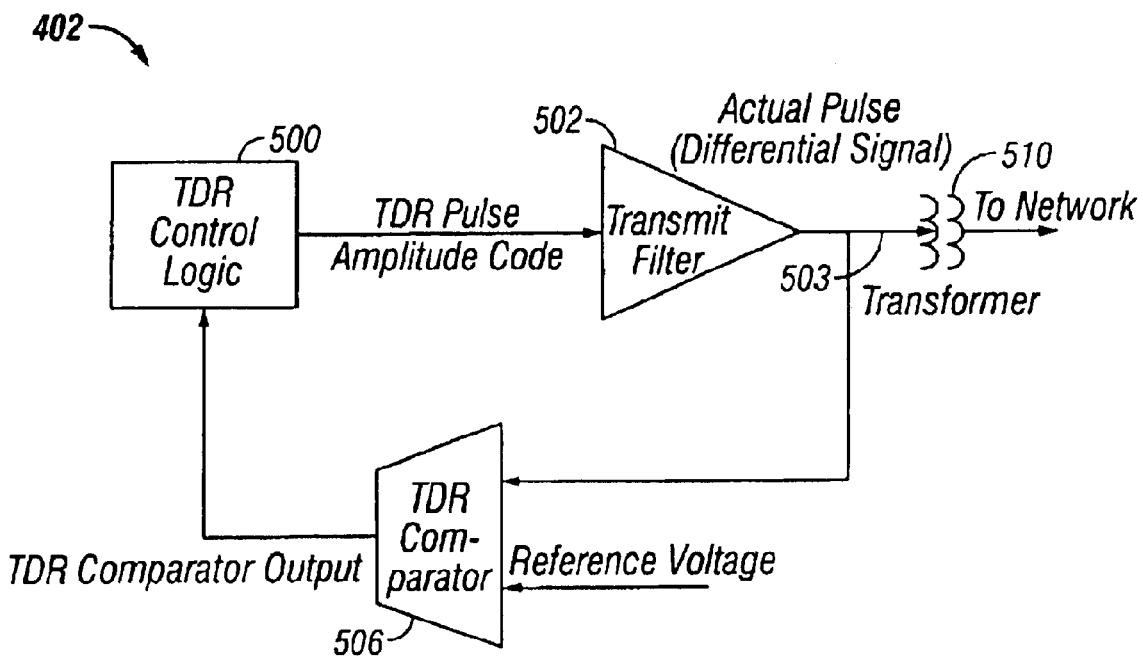
FIG. 5 shows a block diagram illustrating an implementation of time domain reflectometery (TDR) functionality according to one embodiment of the present invention.

Turning now to FIG. 5, FIG. 5 shows a block diagram illustrating an implementation of TDR functionality 402 according to one embodiment of the present invention. More particularly, FIG. 5 illustrates TDR functionality 402 as implemented in the LIU integrated circuit 400, as previously discussed. TDR functionality 402 includes TDR control logic 500, a transmit filter 502 and a TDR comparator 506. The TDR control logic 500 generates a TDR pulse amplitude code which is transmitted to the transmit filter 502. The transmit filter converts the TDR pulse amplitude code into analog format (e.g. an analog TDR pulse) and may also further amplify the analog TDR pulse. The analog TDR pulse is then transmitted through a cable 503 of a network to test for opens. Also, a transformer 510 on the cable is shown that may produce a voltage slope, which may be falsely detected as a reflection, as will be discussed. Further, the TDR functionality 402 may include a TDR comparator 506 that compares the voltage level on the cable 503 with a programmable "reference voltage" or offset. A user, such as a network administrator, can program the reference voltage based on the noise that may be present on the cable, in order to filter that noise out. In this way, the noise will not be falsely detected by the TDR control logic 500 as a reflection.

In some embodiments of the invention, the TDR control logic 500 generates the TDR pulse having a width determined as a function of the multiplication of a TDR pulse count with the period of a TDR clock. The TDR control logic 500 then determines whether the TDR pulse has been reflected back. If the TDR pulse has not been reflected back, the TDR pulse count is successively increased to successively increase the width of the transmitted TDR pulse until a reflection is detected—indicating an open in the cable 503. If a reflection of the TDR pulse has been detected, the TDR control logic 500 calculates and records the distance to the open on the cable 503 associated with reflected TDR pulse. This type of calculation is known in the art. The TDR control logic 500 may then generate a message to a network administrator regarding the open on the cable. Further, more detailed embodiments, will not be discussed.

One advantage of this embodiment of the invention is that the TDR functionality 402 is implemented on an LIU integrated circuit 400. In one particular embodiment, the TDR functionality 402 is implemented in the LXT3108 chip manufactured by INTEL Corp. For example, the LXT3108 chip can be used as an E1/T1 octal LIU chip. As previously discussed, TDR functionality has traditionally been performed by a separate piece of equipment, not by an LIU chip. Integrating the TDR functionality enables users (e.g. a network administrator) to perform the TDR function (e.g. check the network health) by programming the LIU chip remotely, as opposed to sending a technician to the site of interest to perform TDR tests using TDR equipment.

The TDR functionality 402 of the LIU circuit, as particularly shown in FIG. 5, is adjustable for both short-haul and long-haul operations. The TDR control logic 500 transmits a sequence of TDR pulse amplitude codes of increasing widths. The width of each TDR pulse is a function of the multiplication of a TDR pulse count with the period of a TDR clock, where P is the period of the TDR clock that the TDR control logic 500 uses. It should be appreciated that the TDR clock can be internal to the TDR functionality 402, the LIU 400 in general, the line card 306, or from another location. The TDR control logic 500 successively increases each subsequent TDR pulse such that each subsequent TDR pulse is wider than the previous one by P. Both the number and the widths of the TDR pulses sent out by the TDR control logic 500 are programmable. This is accomplished by the user (e.g. a network administrator) programming a sequence of TDR pulse counts. The pulse counts can be denoted by N such as $N_x=N_1 \ldots N_N$ (e.g. 1, . . . , 31). The first TDR pulse count is set to a predetermined number (e.g. $N_1=1$) and the intermediary TDR pulse counts (e.g. $N_2 \ldots N_{N-1}=2 \ldots 30$) and maximum TDR pulse count (e.g. $N_N=31$) can also be programmed by the user. Particularly, the first TDR pulse count $N_1$ is programmed to be a predetermined number to program the initial width ($N_1*P$) of the first TDR pulse, which can be successively increased to width ($N_N*P$). The width of any give TDR pulse is $N_x*P$ nanoseconds (e.g. the width of the first pulse is $N_1*P$ and the width of the last pulse is $N_N*P$). In this manner, the width of the TDR pulses and the number of TDR pulses can be programmed and controlled.

For example, in one embodiment of the invention, the number of TDR pulses sent out may be programmed as having a TDR pulse count $N_x$ of: 1 to 31. The width of the first TDR pulse being equivalent to the first predetermined pulse count ($N_1=1$) multiplied by the period of the TDR clock (P), where P is in nanoseconds. In this embodiment of the invention, the widest TDR pulse that is sent out ($N_N=31$) is about 5 microseconds.

However, this is only one implementation, and the widest TDR pulse can be increased by simply adjusting the period of the TDR clock (P) or by increasing the maximum number ($N_N$) (e.g. $N_N=100$) of the TDR pulse count. Because the TDR control logic 500 is programmable, the TDR pulse count ($N_x=N_1 \ldots N_N$) can be programmed by a user such that the widths of the TDR pulses and the number of TDR pulses that are sent out can be controlled.

For example, short-haul applications will need to send out a smaller width TDR pulses. This guarantees that an open on the cable 503 close to the LIU 400 will be detectable. On the other hand, long-haul applications will need to send out a larger width TDR pulses. This enables the detection of an open on the cable 503 farther from the LIU 400.

Further, in some embodiments of the invention, a user (e.g. a network administrator) can program the TDR control logic 500 to insert dead-band that follows the TDR pulses. During the dead-band, the TDR control logic 500 ignores the voltage level on the cable 503. As discussed earlier, the wider the TDR pulse, the likelier it is that the pulse may be followed by a voltage slope (e.g. due to a transformer 510 on the cable becoming saturated), which could be falsely detected as a reflection (e.g. see FIG. 1) by the TDR control logic 500. In order for the TDR functionality to work properly, the trailing voltage slope (if one exists) needs to be ignored. To accomplish this, the TDR control logic 500 allows the user to define a programmable dead-band that follows the TDR pulse, which is 0–3 times as wide as the TDR pulse that it precedes, and during which the TDR control logic 500 ignores the voltage level on the cable 503. When the actual reflection of the TDR pulse returns (if it does) after the end of the dead-band, the TDR control logic 500 will be able to correctly detect it and estimate how far on the cable 503 the open actually is.

Another advantage of programmable dead-band is that it enables the TDR control logic 500 to transmit wider TDR pulses then would be possible without the use of dead-band. This ultimately extends the reach of the TDR function and is critical for long-haul applications. The programmable dead-band and programmable maximum TDR pulse widths previously described enable the TDR functionality of the TDR control logic 500 to be adjustable to either short-haul or long-haul applications. Preliminary lab experiments indicate that the LIU 400 implementing the TDR functionality 402, as particularly shown in FIG. 5, indicate that TDR pulses can reach ranges from about 40 feet to about 7000 feet (on a gauge 22 cable). Moreover, the range of the reach of the TDR pulses can be increased by sending out wider pulses then have thus far even been particularly tested.

A typical use of the TDR functionality 402 of the LIU 400, as particularly shown in FIG. 5, will now be discussed. Typically, the TDR control logic 500 would first automatically transmit a small number of TDR pulses with zero dead-band. If no reflection is detected, the TDR control logic 500 automatically knows that there is no open at a short distance from the LIU 400. In that case, the TDR control logic 500 automatically and successively increases the number of the TDR pulse count ($N_x$), and therefore the width of the following TDR pulses, in order to detect an open that may be further away on the cable 503. If these wider TDR pulses detect an open at a short distance, this would be an indication that the wider TDR pulses that are being transmitted are followed by a voltage slope (e.g. see FIG. 1). In this case, the TDR control logic 500 repeats the last TDR pulse and also introduces some dead-band. Further, the TDR control logic 500 continues to automatically and sequentially increase the number of the TDR pulse count ($N_x$)—and therefore the width of the TDR pulses. Moreover, the TDR control logic 500 may introduce additional dead-band, if needed. This process continues until the TDR control logic 500 either a detects a distant open on the cable 503 are reaches the maximum TDR pulse width (e.g. by reaching the highest programmed pulse count number $N_N$). In one example, previously discussed, the highest programmed TDR pulse count number would be 31 and the last TDR pulse would be approximately 5 microseconds wide.

Figure 6:
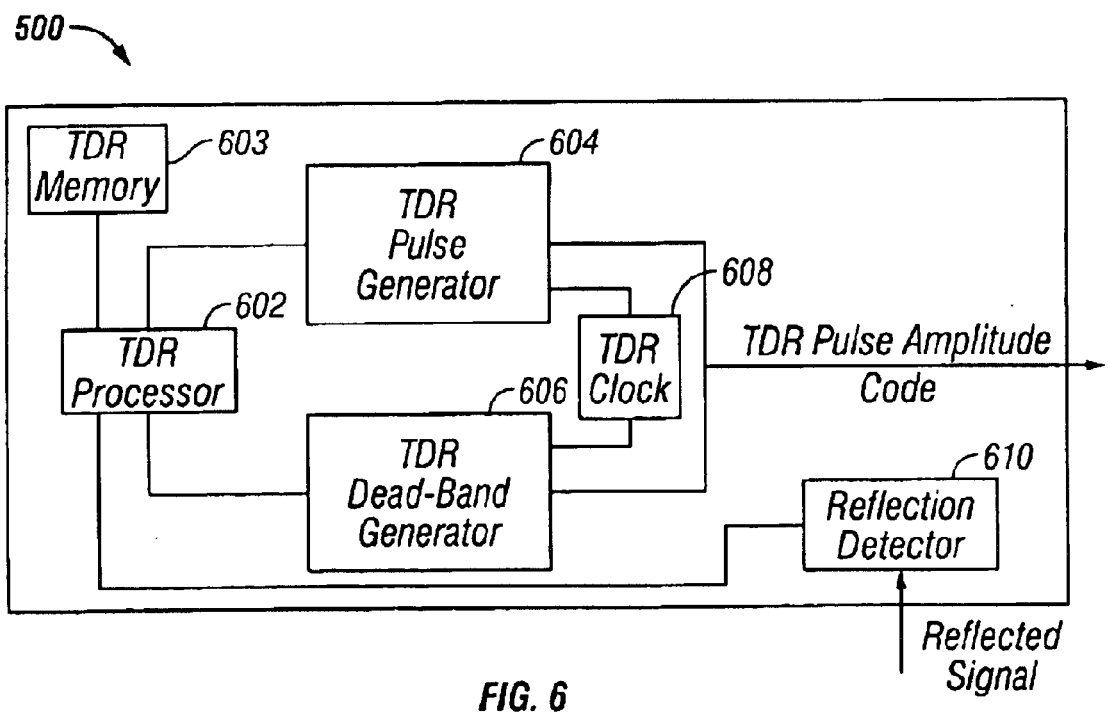
FIG. 6 shows a block diagram particularly illustrating an implementation of TDR control logic according to one embodiment of the present invention.

With reference now to FIG. 6, FIG. 6 shows a block diagram particularly illustrating one type of implementation of the TDR control logic 500 of FIG. 5 according to one embodiment of the present invention. In this embodiment, the TDR control logic 500 includes a TDR processor 602 coupled to a TDR pulse generator 604 and a TDR dead-band generator 606 and a TDR clock 608 coupled to both the TDR pulse generator 604 and the TDR dead-band generator 606. Also, a reflection detector 610 is coupled to the TDR processor 602. TDR memory 603 may also be coupled to the TDR processor 602.

The TDR pulse generator 604 is used to generate a TDR pulse, which is then transmitted through a cable. More particularly, as previously discussed, the TDR pulse generator generates a TDR pulse amplitude code which is converted by the transmit filter into an analog TDR pulse. The TDR pulse generator generates the TDR pulse amplitude code such that the width of the TDR pulse is a function of the multiplication of a TDR pulse count ($N_x$) with the period (P) of the TDR clock 608 (e.g. $N_x*P$), as previously discussed. The TDR pulse count can be programmable by user (e.g. a network administrator). In particular, the user programs or sets the first TDR pulse count ($N_1$) to a predetermined number.

As previously discussed, the transmit filter converts the TDR pulse amplitude code into analog format (e.g. an analog TDR pulse) and may also further amplify the analog TDR pulse. The analog TDR pulse is then transmitted through a cable of a network to test for opens. The reflection detector 610 detects whether a TDR pulse has been reflected back. If so, the TDR processor 602 can calculate and record the distance to an open on the cable associated with reflected TDR pulse and further generate a message to a network administrator regarding the open on the cable. If a reflection is not detected, the TDR processor 602 may successively increase the TDR pulse count to successively increase the width of the transmitted TDR pulse generated by the TDR pulse generator 604 until a reflection is detected, as previously discussed.

Those skilled in the art will recognize that although aspects of the invention and various functional components have been described in particular embodiments, it should be appreciated these aspects and functionalities can be implemented in hardware, software, firmware, middleware or a combination thereof.

In particular, in one embodiment of the invention, aspects of the integrated adjustable TDR functionality 402 for short-haul and long-haul cables can be implemented in the LIU integrated circuit 400 of a line card 306, as previously discussed. The TDR functionality 402 in one embodiment of the invention may be particularly implemented by the TDR control logic 500, which includes the TDR processor 602 and other components to control the TDR functionality as shown in FIG. 6. The processor processes information in order to implement the TDR functionality.

As illustrative examples, the "processor" may include a digital signal processor, a microcontroller, a state machine, or even a central processing unit having any type of architecture, such as complex instruction set computers (CISC), reduced instruction set computers (RISC), very long instruction word (VLIW), or hybrid architecture. Further, the TDR control logic may include TDR memory 603 to aid in implementing the TDR functionality, which can be non-volatile or volatile memory, or any other type of memory, or any combination thereof. Examples of non-volatile memory include Read-only-Memory (ROM) and the like whereas volatile memory includes random access memory (RAM), dynamic random access memory (DRAM) or static random access memory (SRAM), and the like. It should be appreciated that aspects of the TDR functionality of the invention have been shown with reference to the functional diagram of FIG. 6, as an example, but that embodiments of the invention can be implemented in hardware, software, firmware, middleware, or a combination thereof.

In one embodiment of the invention, the aspects of the integrated adjustable TDR functionality 402 for short-haul and long-haul cables can be implemented as one or more instructions (e.g. code segments), to perform the desired functions of the invention. When implemented in software or firmware, the elements of the present invention are the instructions/code segments to perform the necessary tasks. The instructions which when read and executed by a machine or processor (e.g. TDR processor 602), cause the machine or processor to perform the operations necessary to implement and/or use embodiments of the invention. The program or code segments can be stored in a machine readable medium (e.g. a processor readable medium or a computer program product), or transmitted by a computer data signal embodied in a carrier wave, or a signal modulated by a carrier, over a transmission medium or communication link. The machine-readable medium may include any medium that can store or transfer information in a form readable and executable by a machine (e.g. a TDR processor, a computer, etc.). Examples of the machine readable medium include an electronic circuit, a semiconductor memory device, a ROM, a flash memory, an erasable programmable ROM (EPROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via networks such as the Internet, Intranet, etc.

Figure 7:
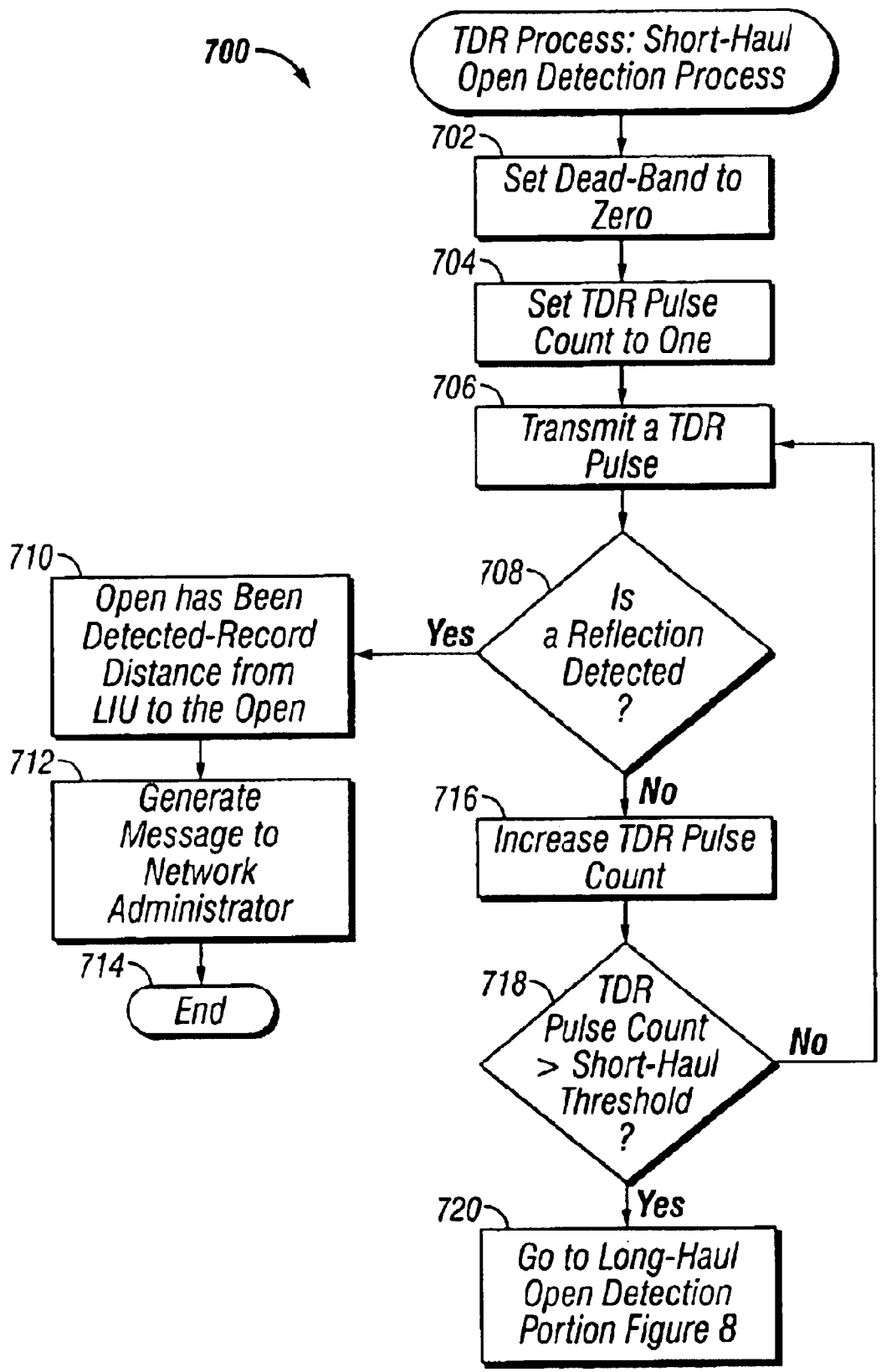
FIG. 7 is a flow diagram illustrating a TDR process for short-haul open detection for a cable according to one embodiment of the present invention.

Turning now to FIG. 7, FIG. 7 is a flow diagram illustrating a TDR process 700 for short-haul open detection for a cable according to one embodiment of the present invention. At block 702, the TDR control logic 500 sets the dead-band to zero. For example, the TDR processor 602 can command the TDR dead-band generator 606 to be set to zero. Next, at block 704, the TDR processor 602 of the TDR control logic 500 sets the first TDR pulse count to one (e.g. $N_1=1$). However, as previously discussed, the first predetermined TDR pulse count can be set any number or value programmed by a user. Moreover, as previously discussed, the TDR pulse count sequence $N_1 \ldots N_N$ can be programmed by a user. The TDR control logic 500 then transmits a TDR pulse amplitude code to the transmit filter 502, as previously discussed, such that an analog TDR pulse is sent down the cable 503 of the network (block 706). For example, the TDR processor 602 may instruct the TDR pulse generator 604 to generate the TDR pulse amplitude code. As previously discussed, the TDR pulse is a function of the multiplication of the current TDR pulse count ($N_x$) with the period of the TDR clock 608.

At block 708, the reflection detector 610 of the TDR control logic 500 determines whether a TDR pulse reflection has been detected. If so, the TDR processor 602 of the TDR control logic 500 calculates and records the distance to the open on the cable associated with reflected TDR pulse (block 710). This calculation is known in the art. Next, the TDR processor 602 generates a message to a network administrator regarding the open on the cable (block 712). The process 700 is then complete (block 714).

On the other hand, if the reflection detector 610 of the TDR control logic 500 does not determine that a TDR pulse reflection has been detected (block 708), then the process 700 proceeds to block 716. At block 716, the TDR processor 602 of the TDR control logic 500 increases the current TDR pulse count ($N_x$) (e.g. the current TDR pulse count is increased by one—$N_{x+1}$).

At block 718, the TDR processor 602 of the TDR control logic 500 determines whether the current TDR pulse count ($N_x$) is greater than a preprogrammed short-haul threshold value. If not, the process 700 returns to block 706 and the TDR processor 602 of the TDR control logic 500 commands the TDR pulse generator 604 to transmit a TDR pulse and the process 700 begins again. However, if the current TDR pulse count ($N_{x+1}$) is greater than a short-haul threshold value then the process 700 proceeds to block 720. At block 720, the TDR processor 602 of the TDR control logic 500 implements a long-haul open detection process.

Figure 8:
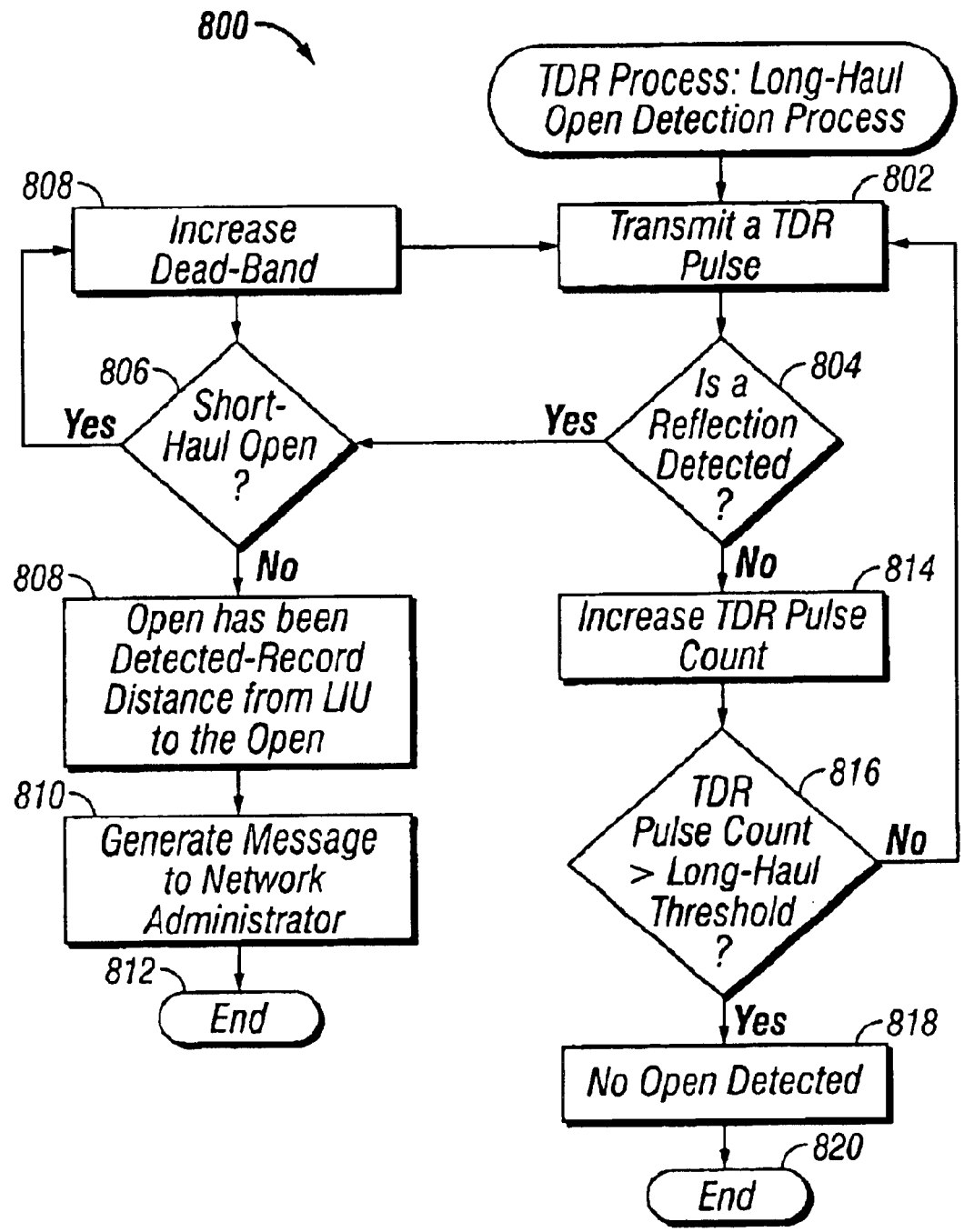
FIG. 8 is a flow diagram illustrating a TDR process for long haul open detection for a cable according to one embodiment of the present invention.

Turning now to FIG. 8, FIG. 8 is a flow diagram illustrating a TDR process 800 for long-haul open detection for a cable according to one embodiment of the present invention. At block 802, the TDR processor 602 of the TDR control logic 500 commands the TDR pulse generator 604 to transmit a TDR pulse.

At block 804, the reflection detector 610 of the TDR control logic 500 determines whether a TDR pulse reflection has been detected. If so, the TDR processor 602 determines whether this was a short-haul open (block 806). This is accomplished by first determining and recording the distance from the LIU 400 to the suspected open. The processor 602 then determines whether or not this was in fact a short-haul open. A short-haul open has occurred if the reflection should have already been detected by the short-haul process 700 of the TDR function, previously discussed (i.e. when the TDR pulse should have occurred with a TDR pulse count less than the short-haul threshold). In this case, what the reflection detector 610 actually detected was a trailing slope that followed the TDR pulse (as previously discussed with reference to FIG. 1). In order to remedy this, the process increases the dead-band (block 808) and then begins process 800 over again at block 802 by having the TDR processor 602 command the TDR pulse generator 604 to transmit a TDR pulse.

On the other hand, if at block 806 a short-haul open has not detected, then an actual open has been detected such that the TDR processor 602 calculates and records the distance from the LIU 400 to the open (block 808). The processor 602 then generates a message to a network administrator regarding the open on the cable (block 812). The process 800 is then complete (block 812).

However, at block 804, if the reflection detector 610 of the TDR control logic 500 does not detect a reflection of the TDR pulse then process 800 proceeds to block 814. At block 814, the TDR processor 602 of the TDR control logic 500 increases the current TDR pulse count ($N_x$) (e.g. the current TDR pulse count is increased by one—$N_{x+1}$). At block 816, the TDR processor 602 determines whether the current TDR pulse count ($N_{x+1}$) is greater then a preprogrammed long-haul threshold value.

If not, the process 800 returns to block 802 and the TDR processor 602 of the TDR control logic 500 commands the TDR pulse generator 604 to transmit a TDR pulse and the process 800 begins again. However, if the current TDR pulse count ($N_{x+1}$) is greater than the long-haul threshold value then the process 800 at block 818 determines that an open has not been detected. The process is then complete (block 820).

It should be appreciated that the previous FIGS. 7 and 8 present only one of a possibility of potential TDR functionality processes that can be utilized using the integrated TDR functionality 402 of the LIU 400, previously discussed. For example, as previously discussed, short-haul process 700 can begin by sending a TDR pulse with a TDR pulse count of one. If no reflection is detected, the TDR functionality progressively increases the TDR pulse count such that increasingly wider TDR pulses are sent out on the cable to detect an open on the cable at increasingly larger distances from the LIU 400.

In short-haul applications, dead-band is not needed (e.g. during the short-haul open detection process 700). However, after a certain preprogrammed TDR pulse count is reached (e.g. the short-haul threshold of process 700 (e.g. short-haul threshold=8)) without detecting open, then the short-haul process determines that the cable does not have an open close to the LIU 400 (i.e. it doesn't have a short-haul open). In that case, the TDR functionality 402 continues with a long-haul open detection process 800 and continues to increment the TDR pulse count. As the TDR functionality is performed on a potentially long haul cable, dead-band can be utilized, as previously discussed, to ensure that a short-haul open does not which may be due to the previously discussed trailing slope that may follow the TDR pulse (e.g. see FIG. 1). If, on the other hand, the long-haul open detection process 800 detects a long haul open on the cable, then the user can be assured that the TDR functionality has detected a valid reflection and a valid long-haul open on the cable.

Integrating TDR functionality 402 in an LIU integrated circuit 400 provides a low-cost solution to users who are interested in utilizing TDR functionality. Users will not have to buy a lot of expensive TDR equipment, like they have been traditionally, but rather users will be able to utilize the adjustable TDR integrated functionality provided by the LIU 400. Further, users (e.g. network administrators) will be able to automatically check the network health utilizing the integrated TDR functionality 402 remotely, without having to send a technician to the location of interest, to check cables of the network. In addition, the TDR functionality 402, as previously discussed, is automatically adjustable for both short-haul and long-haul cables and can test both short-haul and long-haul cables automatically. This enables users to use the LIU 400 in both short-haul and long-haul applications. In this way, the TDR functionality helps serve users needs better then the use of expensive TDR equipment, which requires the use of technician, and previous LIU's that do not have integrated TDR functionality.

While embodiments of the present invention and its various functional components have been described in particular embodiments, it should be appreciated the embodiments of the present invention can be implemented in hardware, software, firmware, middleware or a combination thereof and utilized in systems, subsystems, components, or sub-components thereof. When implemented in software or firmware, the elements of the present invention are the instructions/code segments to perform the necessary tasks. The program or code segments can be stored in a machine readable medium (e.g. a processor readable medium or a computer program product), or transmitted by a computer data signal embodied in a carrier wave, or a signal modulated by a carrier, over a transmission medium or communication link. The machine-readable medium may include any medium that can store or transfer information in a form readable and executable by a machine (e.g. a processor, a computer, etc.). Examples of the machine-readable medium include an electronic circuit, a semiconductor memory device, a ROM, a flash memory, an erasable programmable ROM (EPROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via networks such as the Internet, Intranet, etc.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method for performing integrated adjustable short-haul/long-haul time domain reflectometry, the method comprising:

setting a time domain reflectometry (TDR) pulse count to a predetermined number;

transmitting a TDR pulse, the width of the TDR pulse being a function of the multiplication of the TDR pulse count with the period of a TDR clock;

detecting whether the TDR pulse has been reflected; and
if the TDR pulse has not been reflected, successively increasing the TDR pulse count to successively increase the width of the transmitted TDR pulse until a reflection is detected.

2. The method of claim 1, wherein if a reflection of the TDR pulse has been detected, further comprising calculating and recording the distance to an open on a cable associated with the reflected TDR pulse.

3. The method of claim 2, further comprising, generating a message to a network administrator regarding the open on the cable.

4. The method of claim 1, wherein if a reflection of the TDR pulse has not been detected by a short-haul open detection process, implementing a long-haul open detection process.

5. The method of claim 4, wherein the long-haul open detection process includes transmitting a TDR pulse of greater width than in the short-haul open detection process, the width of the TDR pulse being a function of the multiplication of an increased TDR pulse count with the period of the TDR clock.

6. The method of claim 5, wherein the long-haul open detection process further comprises:
   detecting whether the TDR pulse has been reflected; and
   if not, successively increasing the TDR pulse count, upto a long-haul threshold, to successively increase the width of the transmitted TDR pulse until a reflection has been detected.

7. The method of claim 6, wherein if a reflection of the TDR pulse has been detected, the long-haul open detection process further comprises:
   determining if the reflection should have been detected during the short-haul open detection process; and
   if so, increasing a dead-band factor and transmitting another TDR pulse.

8. The method of claim 7, wherein if a reflection of the TDR pulse has been detected, the long-haul open detection process further comprising calculating and recording the distance to an open on a cable associated with the reflected TDR pulse.

9. The method of claim 8, further comprising, generating a message to a network administrator regarding the open on the cable.

10. The method of claim 6, wherein at least one of the predetermined number for the (TDR) pulse count and the long-haul threshold is programmable.

11. The method of claim 7, wherein the dead-band factor is programmable.

12. A Line Interface Unit (LIU) integrated circuit comprising:
   time domain reflectometry (TDR) control logic including:
      a TDR pulse generator coupled to a TDR clock, the TDR pulse generator to generate a TDR pulse which is then transmitted through a cable, the width of the TDR pulse being a function of the multiplication of a TDR pulse count with the period of the TDR clock; and
      a TDR processor coupled to the TDR pulse generator and a reflection detector, the reflection detector to detect whether the TDR pulse has been reflected;
      wherein, if a reflection is not detected, the TDR processor to successively increase the TDR pulse count to successively increase the width of the transmitted TDR pulse generated by the TDR pulse generator until a reflection is detected.

13. The LIU integrated circuit of claim 12, wherein if a reflection of the TDR pulse has been detected, the TDR processor to calculate and record the distance to an open on a cable associated with the reflected TDR pulse.

14. The LIU integrated circuit of claim 13, wherein the TDR processor generates a message to a network administrator regarding the open on the cable.

15. The LIU integrated circuit of claim 12, wherein if the reflection of the TDR pulse has not been detected by the reflection detector during a short-haul open detection process, the TDR processor implements a long-haul open detection process.

16. The LIU integrated circuit of claim 15, wherein the long-haul open detection process includes the TDR pulse generator transmitting a TDR pulse of greater width than in the short-haul open detection process, the width of the TDR pulse being a function of the multiplication of an increased TDR pulse count with the period of the TDR clock.

17. The LIU integrated circuit of claim 16, wherein the long-haul open detection process further comprises:
   detecting whether the TDR pulse has been reflected utilizing the reflection detector; and
   if not, the TDR processor to successively increase the TDR pulse count, upto a long-haul threshold, to successively increase the width of the TDR pulse transmitted by the TDR pulse generator until a reflection has been detected.

18. The LIU integrated circuit of claim 17, further comprising a TDR dead band generator, wherein if a reflection of the TDR pulse has been detected, the long-haul open detection process further includes:
   the TDR processor to determine if the reflection should have been detected during the short-haul open detection process; and
   if so, the TDR processor to command the TDR dead band generator to increase a dead-band factor and the TDR pulse generator to transmit another TDR pulse.

19. The LIU integrated circuit of claim 18, wherein if a reflection of the TDR pulse has been detected by the reflection detector, the TDR processor implementing the long-haul open detection process calculates and records the distance to an open on a cable associated with the reflected TDR pulse.

20. The LIU integrated circuit control logic of claim 19, further comprising, the TDR processor generating a message to a network administrator regarding the open on the cable.

21. The LIU integrated circuit of claim 17, wherein at least one of an initial number for the (TDR) pulse count and the long-haul threshold is programmable.

22. The LIU integrated circuit of claim 18, wherein the dead-band factor is programmable.

23. A system for performing integrated adjustable short-haul/long-haul time domain reflectometry, the system comprising:
   an access device coupling a first network to a second network, the access device having at least one line card including at least one Line Interface Unit (LIU) integrated circuit that includes:
   time domain reflectometry (TDR) control logic comprising:
      a TDR pulse generator coupled to a TDR clock, the TDR pulse generator to generate a TDR pulse which is then transmitted through a cable, the width of the TDR pulse being a function of the multiplication of a TDR pulse count with the period of the TDR clock; and
      a TDR processor coupled to the TDR pulse generator and a reflection detector, the reflection detector to detect whether the TDR pulse has been reflected;
      wherein, if a reflection is not detected, the TDR processor to successively increase the TDR pulse count to successively increase the width of the transmitted TDR pulse generated by the TDR pulse generator until a reflection is detected.

24. The system of claim 23, wherein if a reflection of the TDR pulse has been detected, the TDR processor to calculate and record the distance to an open on a cable associated with the reflected TDR pulse.

25. The system of claim 24, wherein the TDR processor generates a message to a network administrator regarding the open on the cable.

26. The system of claim 23, wherein if the reflection of the TDR pulse has not been detected by the reflection detector during a short-haul open detection process, the TDR processor implements a long-haul open detection process.

27. The system of claim 26, wherein the long-haul open detection process includes the TDR pulse generator transmitting a TDR pulse of greater width than in the short-haul open detection process, the width of the TDR pulse being a function of the multiplication of an increased TDR pulse count with the period of the TDR clock.

28. The system of claim 27, wherein the long-haul open detection process further comprises:
   detecting whether the TDR pulse has been reflected utilizing the reflection detector; and
   if not, the TDR processor to successively increase the TDR pulse count, upto a long-haul threshold, to successively increase the width of the TDR pulse transmitted by the TDR pulse generator until a reflection has been detected.

29. The system of claim 28, further comprising a TDR dead band generator, wherein if a reflection of the TDR pulse has been detected, the long-haul open detection process further includes:
   the TDR processor to determine if the reflection should have been detected during the short-haul open detection process; and
      if so, the TDR processor to command the TDR dead band generator to increase a dead-band factor and the TDR pulse generator to transmit another TDR pulse.

30. The system of claim 29, wherein if a reflection of the TDR pulse has been detected by the reflection detector, the TDR processor implementing the long-haul open detection process calculates and records the distance to an open on a cable associated with the reflected TDR pulse.

31. The system of claim 30, further comprising, the TDR processor generating a message to a network administrator regarding the open on the cable.

32. The system of claim 28, wherein at least one of an initial number for the (TDR) pulse count and the long-haul threshold is programmable.

33. The system of claim 29, wherein the dead-band factor is programmable.

34. A machine-readable medium having stored thereon instructions, which when executed by a Line Interface Unit (LIU) integrated circuit, cause the LIU integrated circuit to perform the following operations:
   setting a time domain reflectometry (TDR) pulse count to a predetermined number;
   transmitting a TDR pulse, the width of the TDR pulse being a function of the multiplication of the TDR pulse count with the period of a TDR clock;
   detecting whether the TDR pulse has been reflected; and
      if the TDR pulse has not been reflected, successively increasing the TDR pulse count to successively increase the width of the transmitted TDR pulse until a reflection is detected.

35. The machine-readable medium of claim 34, wherein if a reflection of the TDR pulse has been detected, further comprising calculating and recording the distance to an open on a cable associated with the reflected TDR pulse.

36. The machine-readable medium of claim 35, further comprising, generating a message to a network administrator regarding the open on the cable.

37. The machine-readable medium of claim 34, wherein if a reflection of the TDR pulse has not been detected by a short-haul open detection process, implementing a long-haul open detection process.

38. The machine-readable medium of claim 37, wherein the long-haul open detection process includes transmitting a TDR pulse of greater width than in the short-haul open detection process, the width of the TDR pulse being a function of the multiplication of an increased TDR pulse count with the period of the TDR clock.

39. The machine-readable medium of claim 38, wherein the long-haul open detection process further comprises:
   detecting whether the TDR pulse has been reflected; and
   if not, successively increasing the TDR pulse count, upto a long-haul threshold, to successively increase the width of the transmitted TDR pulse until a reflection has been detected.

40. The machine-readable medium of claim 39, wherein if a reflection of the TDR pulse has been detected, the long-haul open detection process further comprises:
   determining if the reflection should have been detected during the short-haul open detection process; and
      if so, increasing a dead-band factor and transmitting another TDR pulse.

41. The machine-readable medium of claim 40, wherein if a reflection of the TDR pulse has been detected, the long-haul open detection process further comprising calculating and recording the distance to an open on a cable associated with the reflected TDR pulse.

42. The machine-readable medium of claim 41, further comprising, generating a message to a network administrator regarding the open on the cable.

43. The machine-readable medium of claim 39, wherein at least one of the predetermined number for the (TDR) pulse count and the long-haul threshold is programmable.

44. The machine-readable medium of claim 40, wherein the dead-band factor is programmable.

* * * * *

UNITED STATES PATENT AND TRADEMARK OFFICE
CERTIFICATE OF CORRECTION

PATENT NO. : 6,862,546 B2
DATED : March 1, 2005
INVENTOR(S) : Kaburlasos et al.

It is certified that error appears in the above-identified patent and that said Letters Patent is hereby corrected as shown below:

Column 6,
Line 39, delete "T1/E1/J3" and insert -- T1/E1/J1 --.

Signed and Sealed this

Sixth Day of September, 2005

JON W. DUDAS
*Director of the United States Patent and Trademark Office*